(12) United States Patent
Chung et al.

(10) Patent No.: US 7,663,445 B2
(45) Date of Patent: Feb. 16, 2010

(54) VOLTAGE-CONTROL OSCILLATOR CIRCUITS WITH COMBINED MOS AND BIPOLAR DEVICE

(75) Inventors: Shine Chung, San Jose, CA (US); Fu-Lung Hsueh, HisnChu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 17 days.

(21) Appl. No.: 12/237,187

(22) Filed: Sep. 24, 2008

(65) Prior Publication Data

US 2009/0174487 A1 Jul. 9, 2009

Related U.S. Application Data

(60) Provisional application No. 61/020,132, filed on Jan. 9, 2008.

(51) Int. Cl.
*H03B 5/12* (2006.01)

(52) U.S. Cl. .................. 331/117 R; 331/117 FE; 331/177 R; 331/108 C

(58) Field of Classification Search .............. 331/117 R, 331/117 FE, 167, 177 R, 34, 108 C
See application file for complete search history.

(56) References Cited

U.S. PATENT DOCUMENTS 6,970,048 B1 * 11/2005 Devnath et al. ............... 331/46

7,034,623 B2 * 4/2006 Khalil .......................... 331/34
7,145,407 B2 * 12/2006 Jeon et al. ................. 331/108 C
2007/0105301 A1 * 5/2007 Chen et al. ................... 438/234

OTHER PUBLICATIONS

Kakani et al., "A 5GHz Series Coupled BiCMOS Quadrature VCO with Wide Tuning Range", Bipolar/BiCMOS Circuits and Technology Meeting, 2006, Oct. 8-10, 2006, pp. 1-4.*
Rofougaran et al., "A 900 MHz CMOS LC-Oscillator with Quadrature Outputs", Solid-State Circuits Conference, 1996. Digest of Technical Papers. 43rd ISSCC., 1996 IEEE International, Feb. 8-10, 1996, pp. 392-393.*

* cited by examiner

*Primary Examiner*—Robert Pascal
*Assistant Examiner*—Ryan J Johnson
(74) *Attorney, Agent, or Firm*—K&L Gates LLP

(57) ABSTRACT

A voltage controlled oscillator includes: a first merged device having a first bipolar transistor and a first MOS transistor, the first bipolar transistor having a collector sharing a common active area with a source/drain of the first MOS transistor, and an emitter sharing the common active area with another source/drain of the first MOS transistor, a second merged device having a second bipolar transistor and a second MOS transistor, the second bipolar transistor having a collector sharing a common active area with a source/drain of the second MOS transistor, and an emitter sharing the common active area with another source/drain of the second MOS transistor, and a first inductor connected to both the collector of the first bipolar transistor and a base of the second bipolar transistor.

20 Claims, 4 Drawing Sheets

VOLTAGE-CONTROL OSCILLATOR CIRCUITS WITH COMBINED MOS AND BIPOLAR DEVICE

BACKGROUND

The present invention claims priority to U.S. Provisional Application No. 61/020,132 filed Jan. 9, 2008. The present invention relates generally to integrated circuit (IC) designs, and more particularly to a voltage-control oscillator circuits with combined MOS/bipolar device for various circuit design applications.

A voltage-controlled oscillator (VCO) is an electronic oscillator designed to be controlled in oscillation frequency by a voltage input. The VCO generates a signal varying at two predetermined voltages levels at a frequency controlled by the voltage input. The VCO can be found in various circuits, such as phase-locked loops in communication applications. These phase-locked loops are able to generate stable frequencies, recover a signal from a noisy communication channel, or distribute clock timing pulses in digital logic designs.

FIG. 1A schematically illustrates a conventional Hartley oscillator 100 comprised of a bipolar transistor 102, a resistor 110, a capacitor 108 and inductors 104 and 106 for the purposes of explaining the operation of a simple electronic oscillator. The bipolar transistor 102 has a collector connected to an end of the resistor, an emitter connected between the inductors 104 and 106, and a base connected to an end of the capacitor. The resistor 110 is connected between the collector of the bipolar transistor 102 and the inductor 106 or the capacitor 108. The inductors 104 and 106 are serially connected, with one end of the inductor chain connected to the base of the bipolar transistor 102 and the capacitor 108, and another end connected to the resistor 110 and the capacitor 108. The capacitor 108, the chain of inductors 104 and 106, and the resistor 110 are arranged in parallel.

In operation, a bias is applied to the base of the bipolar transistor 102 for controlling the amplified current output from the emitter. The amplified current from the emitter is directed back to the base to induce the next cycle of current amplification. The inductors 104 and 106, the capacitor 108, and the resistor 110 make up a LCR circuit that provides the bipolar transistor 102 with impedance to adjust the frequency of the current amplification cycles of the bipolar transistor 102. Changing the impedance results in a change of the oscillation frequency.

FIG. 1B is a schematic diagram illustrating a voltage-controlled oscillator (VCO) commonly used in radio frequency (RF) devices for telecommunication applications. Serially connected inductor 152 and capacitor 164 form a LC oscillator with a NMOS transistor 172 periodically "on" and "off" to control the discharging and charging, respectively, of the capacitor 164. Symmetrically, serially connected inductor 154 and capacitor 162 form another LC oscillator with a NMOS transistor 174 periodically "on" and "off" to control the discharging and charging, respectively, of the capacitor 162. A gate of the NMOS transistor 172 is connected to a node B. Voltage at the node B increases as the capacitor 162 is charging up. When the voltage at the node B passes a threshold voltage of the NMOS transistor 172, the NMOS transistor 172 will be turned "on" and cause the capacitor 164 to discharge. Symmetrically, a gate of the NMOS transistor 174 is connected to a node A. Voltage at the node A increases as the capacitor 164 is charging up. When the voltage at the node A passes a threshold voltage of the NMOS transistor 174, the NMOS transistor 174 will be turned "on" and cause the capacitor 162 to discharge. In order to control the frequencies of oscillators, a controllable voltage is applied to the capacitors 162 and 164 at a node VTUNE. Capacitances of the capacitors 162 and 164 vary, so are the frequencies, proportionally to the changes of the voltage at the node VTUNE. In fact, the capacitors 162 and 164 with voltage controlled variable capacitance are called varactors.

However, varactors are conventionally formed by a vertical structure in a bipolar process while virtually all other devices in a chip are manufactured in a CMOS processes. Separate bipolar process steps add cost and complexity to the CMOS process. As such, what is desired in VCO with simple device structures and a manufacturing process compatible with the common CMOS process.

SUMMARY

The present invention is directed to a VCO implemented with merged MOS transistor and BJT devices. In one embodiment of the present invention, the VCO comprises a first merged device having a first bipolar transistor and a first MOS transistor, the first bipolar transistor having a collector sharing a common active area with a source/drain of the first MOS transistor, and an emitter sharing the common active area with another source/drain of the first MOS transistor, a second merged device having a second bipolar transistor and a second MOS transistor, the second bipolar transistor having a collector sharing a common active area with a source/drain of the second MOS transistor, and an emitter sharing the common active area with another source/drain of the second MOS transistor, a first inductor connected to both the collector of the first bipolar transistor and a base of the second bipolar transistor, and a second inductor connected to both the collector of the second bipolar transistor and a base of the first bipolar transistor.

In another embodiment of the present invention, the VCO comprises a first merged device having a first bipolar transistor and a first MOS transistor, the first bipolar transistor having a collector sharing a common active area with a source/drain of the first MOS transistor, and an emitter sharing the common active area with another source/drain of the first MOS transistor, a second merged device having a second bipolar transistor and a second MOS transistor, the second bipolar transistor having a collector sharing a common active area with a source/drain of the second MOS transistor, and an emitter sharing the common active area with another source/drain of the second MOS transistor, a first inductor connected to the source/drain of the first MOS transistor and a gate of the second MOS transistor, and a second inductor connected to the source/drain of the second MOS transistor and a gate of the first MOS transistor.

The construction and method of operation of the invention, however, together with additional objectives and advantages thereof will be best understood from the following description of specific embodiments when read in connection with the accompanying drawings.

DESCRIPTION

This invention describes voltage controlled oscillators (VCOs) that utilize merged metal-on-silicon (MOS) transistors and bipolar junction transistors (BJT). The following merely illustrates various embodiments of the present invention for purposes of explaining the principles thereof. It is understood that those skilled in the art will be able to devise various equivalents that, although not explicitly described herein, embody the principles of this invention.

A published US patent application, No. 2007/0105301, by the same assignee depicts a merged MOS and BJT structure. The contents of the published US patent application are herein incorporated by reference in their entirety.

Figure 2A:
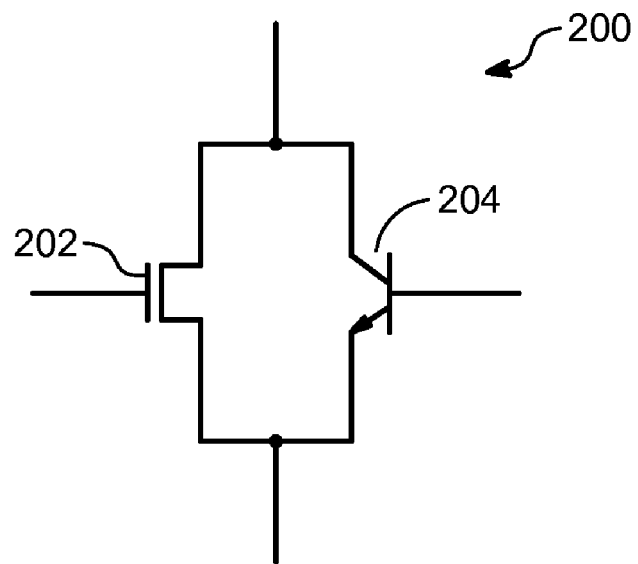
FIGS. 2A and 2B schematically illustrate merged MOS transistor and BJT devices.

FIG. 2A is a schematic diagram representing a merged NMOS transistor and a NPN bipolar transistor device 200. The merged device 200 is comprised of an NMOS transistor 202 and an NPN bipolar transistor 204. The NMOS transistor 202 has a source/drain terminal sharing a common active area with a collector of the NPN bipolar transistor 204, and another source/drain terminal sharing a common active area with an emitter of the NPN bipolar transistor 204. The gate of the NMOS transistor 202 is adapted to be controlled by a control signal. The base of the NPN bipolar transistor 204 is adapted to be biased to increase the current gain between the collector and the emitter.

Figure 2B:
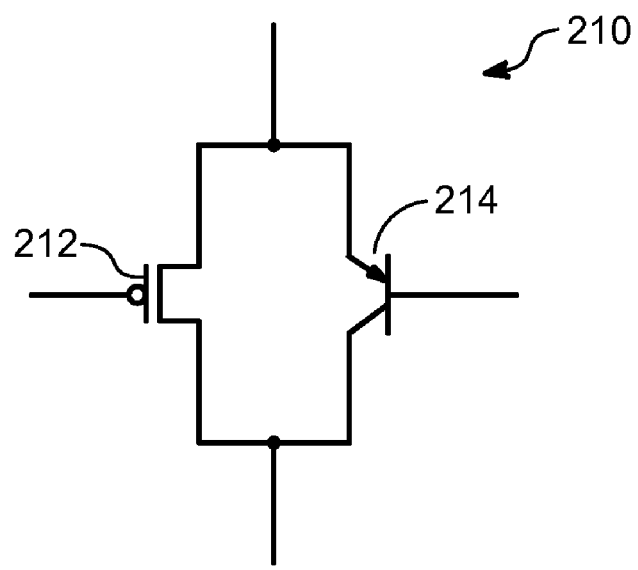

Similarly, FIG. 2B is a schematic diagram representing a merged PMOS transistor and a PNP bipolar transistor device 210. The merged device 210 is comprised of a PMOS transistor 212 and a PNP bipolar transistor 214. The PMOS transistor 212 has a source/drain terminal sharing a common active area with a collector of the PNP bipolar transistor 214, and another source/drain terminal sharing a common active area with an emitter of the PNP bipolar transistor 214. The gate of the PMOS transistor 212 is adapted to be controlled by a control signal. The base of the PNP transistor 214 is adapted to be biased to increase the current gain between the collector and the emitter. As discussed in the published US patent application, No. 2007/0105301, the merged devices 200 and 210 are fully compatible with common CMOS processes.

Figure 3A:
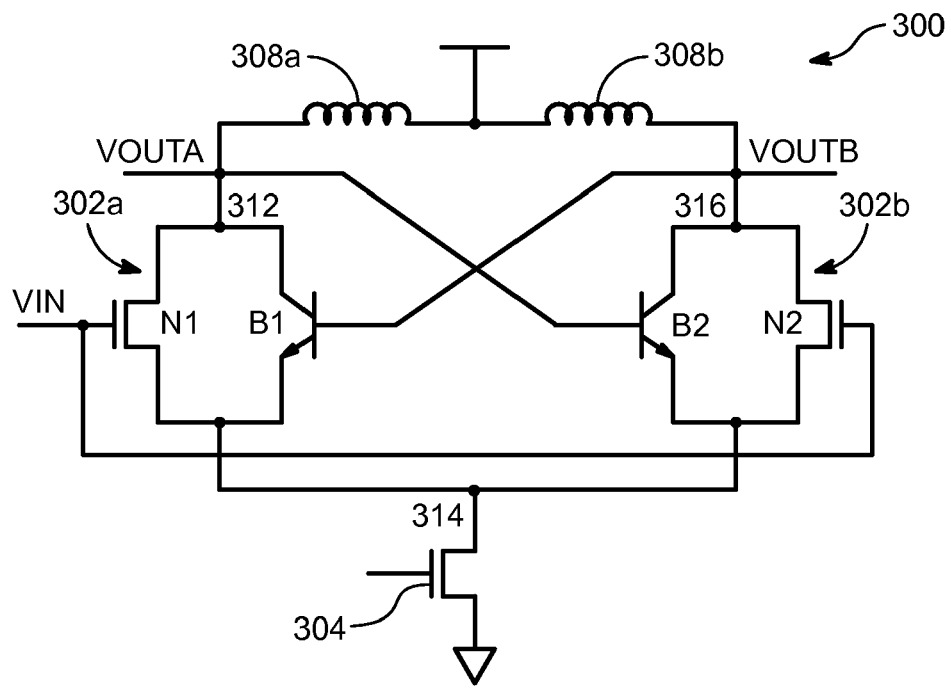
FIGS. 3A and 3B schematically illustrates voltage controlled oscillators using the proposed merged MOS transistor and BJT devices in accordance with one embodiment of the present invention.

FIG. 3A schematically illustrates a VCO 300 using the merged MOS and BJT device 200 shown in FIG. 2A in accordance with one embodiment of the present invention. The VCO 300 is comprised of the merged MOS and BJT devices 302a and 302b, inductors 308a and 308b, and a supply current device 304. The inductors 308a and 308b are serially connected between the merged MOS and BJT devices 302a and 302b, wherein a power supply VDD is connected to the terminal that serially connecting the two inductors 308a and 308b. The merged MOS and BJT device 302a is comprised of an NMOS transistor N1 and an NPN bipolar transistor B1. The NMOS transistor N1 has a drain sharing a common active area with a collector of the NPN bipolar transistor B1 at a node 312, and a source sharing a common active area with an emitter of the NPN bipolar transistor B1 at a node 314. The merged MOS and BJT device 302b is comprised of an NMOS transistor N2 and an NPN bipolar transistor B2. The NMOS transistor N2 has a drain sharing a common active area with a collector of the NPN bipolar transistor B2 at a node 316, and a source sharing a common active area with an emitter of the NPN bipolar transistor B2 at the node 314. The gates of the NMOS transistors N1 and N2 are connected together and controlled by a control signal VIN. The base of the bipolar device B1 is connected to the node 316, which is further connected to the inductor 308b, the collector of the bipolar transistor B2, and the drain of the NMOS transistor N2. The base of the bipolar transistor B2 is connected to the node 312, which is further connected to the inductor 308a, the collector of the bipolar transistor B1, and the drain of the NMOS transistor N1. Capacitance between collector and emitter of the bipolar transistor B1 serves as a charging and discharging capacitor for the inductor 308a. Similarly, capacitance between collector and emitter of the bipolar transistor B2 serves as a charging and discharging capacitor for the inductor 308b. The NMOS transistor 304 limits the current supply to the merged MOS and BJT devices 302a and 302b, therefore, can control oscillation frequency of the VCO 300.

In operation, as the power supply VDD charging up the capacitances in the bipolar transistors B1 and B2, voltage at the nodes 312 and 316 increase until to a point where the bipolar transistors B1 and B2 are turned on. Then the capacitances in the bipolar transistors B1 and B2 discharge to a point the bipolar transistors B1 and B2 being turned off and start another charging process. The NMOS transistors N1 and N2 can control the oscillation through the bipolar transistors B1 and B1, respectively, by shorting the collector and emitter of the same. Either DC of AC signal may be applied at the node VIN. With the combination of the NMOS transistors N1 and N2 with the bipolar transistors B1 and B2, the VCO 300 can operate at much higher oscillation frequency level than conventional VCOs.

Figure 1A:
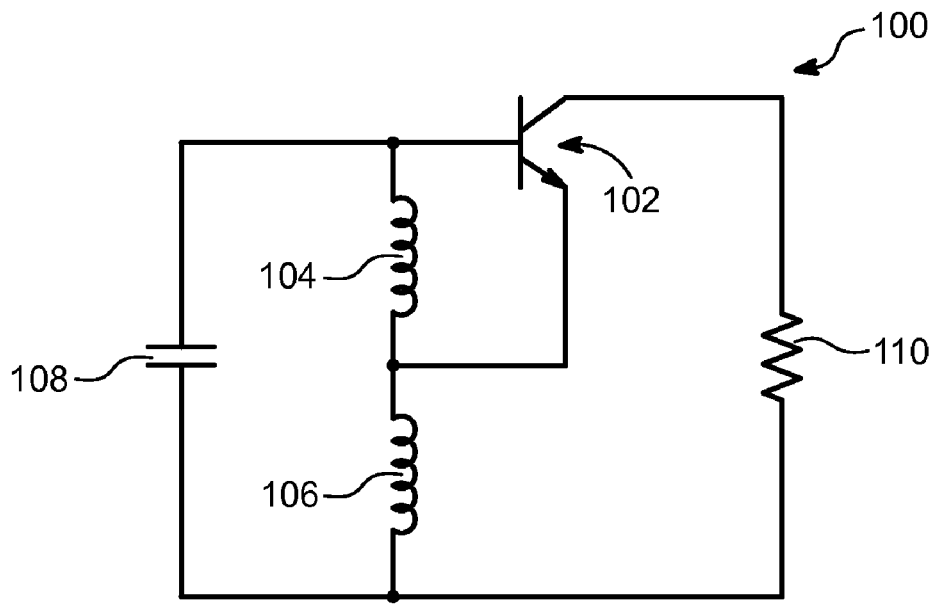
FIGS. 1A and 1B schematically illustrate conventional electronic oscillators.
Figure 1B:
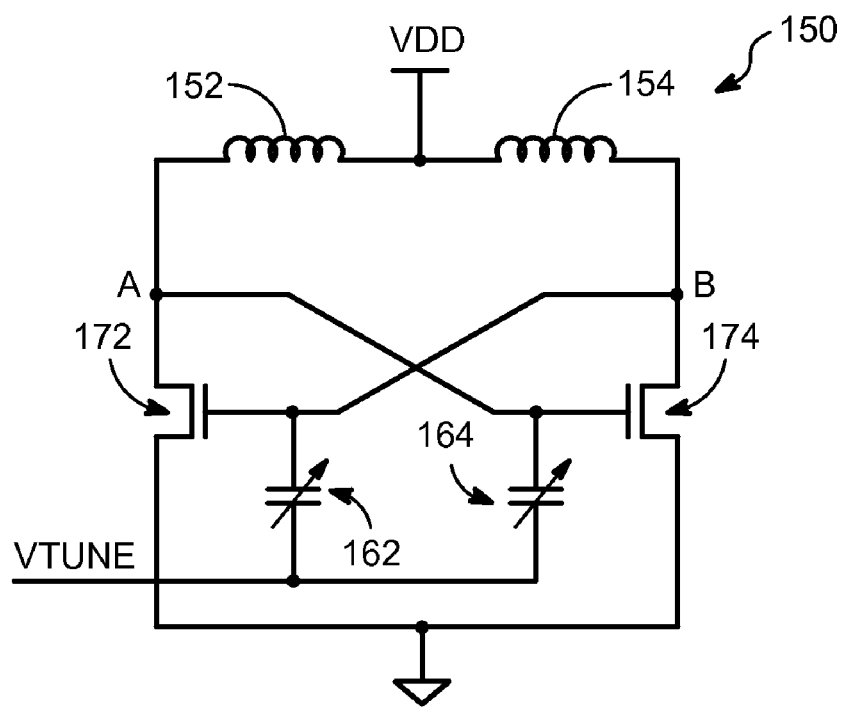
Figure 3B:
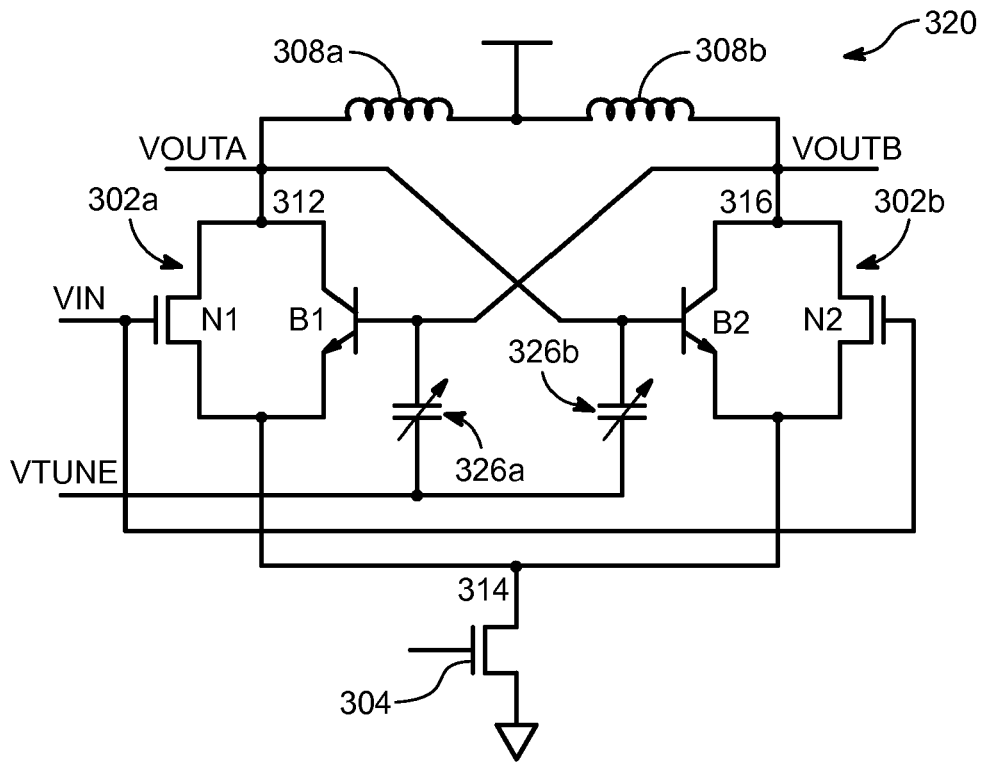

FIG. 3B schematically illustrates a VCO 320 also using the merged MOS and BJT device 200 shown in FIG. 2A in accordance with another embodiment of the present invention. The only different between the VCO 320 and the VCO 300 shown in FIG. 3A is that a pair of varactors 326a and 326b is added to the VCO 320 between the bases of the bipolar transistors B1 and B2, respectively, and a node VTUNE. The VCO 320 resembles the conventional VCO 150 shown in FIG. 1B, with the merged MOS and BJT devices 302a and 302b of FIG. 3B replacing the NMOS transistors 172 and 174 of FIG. 1B, respectively. The varactors 326a and 326b of FIG. 3B performs the same charging and discharging functions as the varactors 162 and 164 of FIG. 1B. A voltage applied at the node VTUNE can further tune the frequency range of the VCO 320.

Figure 4A:
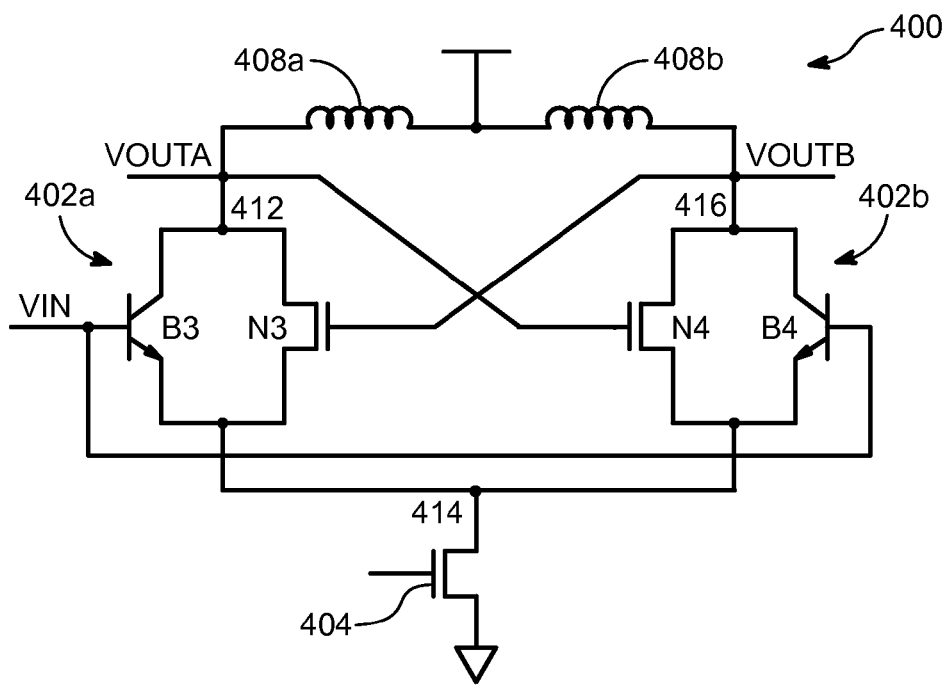
FIGS. 4A and 4B schematically illustrates voltage controlled oscillators using the proposed merged MOS transistor and BJT devices in accordance with another embodiment of the present invention.

Alternatively, FIG. 4A schematically illustrates a VCO 400 using the merged MOS and BJT device 200 shown in FIG. 2A in accordance with yet another embodiment of the present invention. The VCO 400 is comprised of the merged MOS and BJT devices 402a and 402b, inductors 408a and 408b, and a supply current device 404. The inductors 408a and 408b are serially connected between the merged MOS and BJT devices 402a and 402b, wherein a power supply VDD is connected to the terminal that serially connecting the two inductors 408a and 408b. The merged MOS and BJT device 402a is comprised of an NMOS transistor N3 and an NPN bipolar transistor B3. The NMOS transistor N3 has a drain shares a collector of the NPN bipolar transistor B3 at a node 412, and a source sharing a common active area with an emitter of the NPN bipolar transistor B3 at a node 414. The merged MOS and BJT device 402b is comprised of an NMOS transistor N4 and an NPN bipolar transistor B4. The NMOS transistor N4 has a drain sharing a common active area with a collector of the NPN bipolar transistor B4 at a node 416, and a source sharing a common active area with an emitter of the NPN bipolar transistor B4 at the node 414. The bases of the bipolar transistors B3 and B4 are connected together and controlled by a control signal VIN. The gate of the NMOS transistor N3 is connected to the node 416, which is further connected to the inductor 408b, the collector of the bipolar transistor B4, and the drain of the NMOS transistor N4. The gate of the NMOS transistor N4 is connected to the node 412, which is further connected to the inductor 408a, the collector of the bipolar transistor B3, and the drain of the NMOS transistor N3. Capacitance between source and drain of the NMOS transistor N3 serves as a charging and discharging capacitor for the inductor 408a. Similarly, capacitance between source and drain of the NMOS transistor N4 serves as a charging and discharging capacitor for the inductor 408b. The NMOS transistor 404 limits the current supply to the merged MOS and BJT devices 402a and 402b, therefore, can control oscillation frequency of the VCO 400.

In operation, as the power supply VDD charging up the capacitances in the NMOS transistors N3 and N4, voltage at the nodes 412 and 416 increase until to a point where the NMOS transistors N3 and N4 are turned on. Then the capacitances in the NMOS transistors N3 and N4 discharge to a point the NMOS transistors N3 and N4 being turned off and start another charging process. The bipolar transistors B3 and B4 can control the oscillation through the NMOS transistors N3 and N4, respectively, by shorting the source and drain of the same. Either DC of AC signal may be applied at the node VIN. With the combination of the bipolar transistors B3 and B4 with the NMOS transistors N3 and N4, the VCO 400 can operate at much higher oscillation frequency level than conventional VCOs.

Referring to both FIGS. 3A and 4A, the difference between the VCO 300 and the VCO 400 is that in the VCO 300, the bipolar transistors B1 and B2 are used as the charging and discharging capacitors for producing an oscillation, while in the VCO 400, the NMOS transistor N3 and N4 are used for the charging and discharging capacitors. This demonstrates the versatility of the merged MOS and BJT device.

Figure 4B:
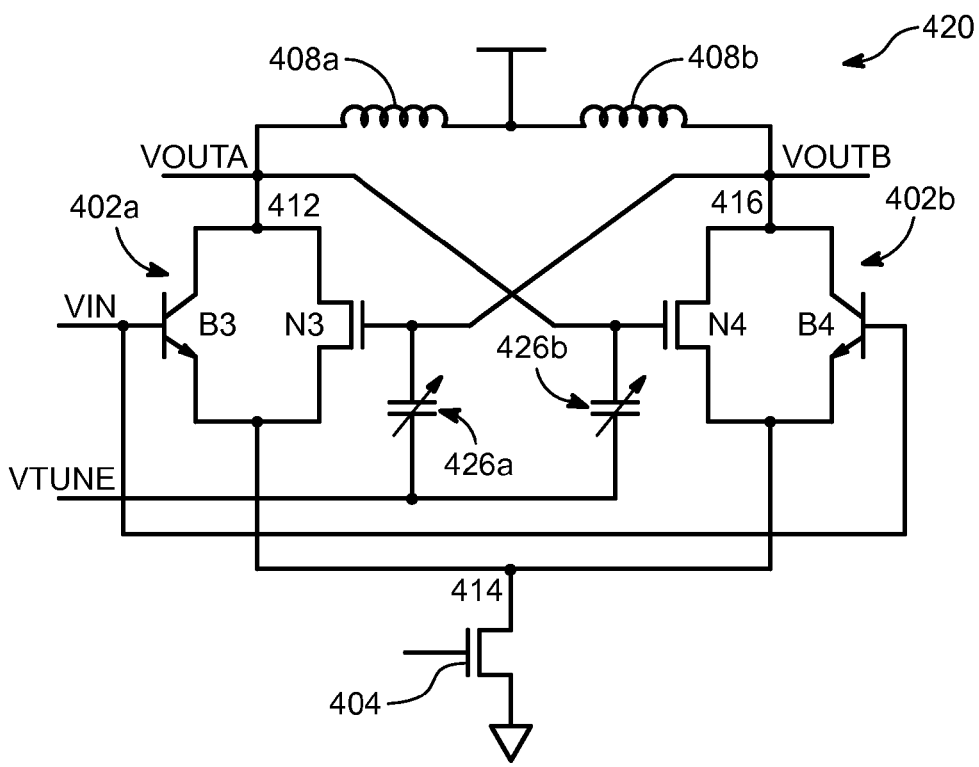

FIG. 4B schematically illustrates a VCO 420 also using the merged MOS and BJT device 200 shown in FIG. 2A in accordance with yet another embodiment of the present invention. The only different between the VCO 420 and the VCO 400 shown in FIG. 4A is that a pair of varactors 426a and 426b is added to the VCO 420 between the gates of the NMOS transistors N3 and N4, respectively, and a node VTUNE. The VCO 420 resembles the conventional VCO 150 shown in FIG. 1B, with the merged MOS and BJT devices 402a and 402b of FIG. 4B replacing the NMOS transistors 172 and 174 of FIG. 1B, respectively. The varactors 426a and 426b of FIG. 4B performs the same charging and discharging functions as the varactors 162 and 164 of FIG. 1B. A voltage applied at the node VTUNE can further tune the frequency range of the VCO 420.

It is noted that although the above embodiments disclose using the merged devices of NMOS transistors and NPN bipolar transistors in the proposed VCOs, other merged devices comprised of PMOS transistors and PNP bipolar transistors, such as the one shown in FIG. 2B, can also be used for the VCOs. The construction of the VCOs using the merged PMOS and PNP bipolar transistors is similar to those described in FIGS. 3 and 4, and is readily appreciated by people skilled in the art in view of the disclosures of the specification without undue experiments.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A voltage controlled oscillator comprising:
a first merged device having a first bipolar transistor and a first MOS transistor, the first bipolar transistor having a collector sharing a common active area with a source/drain of the first MOS transistor, and an emitter sharing the common active area with another source/drain of the first MOS transistor;
a second merged device having a second bipolar transistor and a second MOS transistor, the second bipolar transistor having a collector sharing a common active area with a source/drain of the second MOS transistor, and an emitter sharing the common active area with another source/drain of the second MOS transistor; and
a first inductor connected to both the collector of the first bipolar transistor and a base of the second bipolar transistor.

2. The voltage controlled oscillator of claim 1, wherein both the first and second bipolar transistors are NPN type, and both the first and second MOS transistors are NMOS type.

3. The voltage controlled oscillator of claim 1, wherein gates of the first and second MOS transistors are connected together and being applied a voltage for controlling the frequency of the voltage controlled oscillator.

4. The voltage controlled oscillator of claim 1 further comprises a second inductor connected to both the collector of the second bipolar transistor and a base of the first bipolar transistor.

5. The voltage controlled oscillator of claim 1 further comprises:
a first varactor connected between the base of the first bipolar transistor and a first node; and
a second varactor connected between the base of the second bipolar transistor and the first node,
wherein a voltage supplied at the first node further controls the frequency of the voltage controlled oscillator.

6. The voltage controlled oscillator of claim 1 further comprises current control device for limiting current supply to both the first and second merged devices.

7. The voltage controlled oscillator of claim 6, wherein the current control device is a NMOS transistor.

8. A voltage controlled oscillator comprising:
a first merged device having a first bipolar transistor and a first MOS transistor, the first bipolar transistor having a collector sharing a common active area with a source/drain of the first MOS transistor, and an emitter sharing the common active area with another source/drain of the first MOS transistor;
a second merged device having a second bipolar transistor and a second MOS transistor, the second bipolar transistor having a collector sharing a common active area with a source/drain of the second MOS transistor, and an emitter sharing the common active area with another source/drain of the second MOS transistor;
a first inductor connected to both the collector of the first bipolar transistor and a base of the second bipolar transistor; and second inductor connected to both the collector of the second bipolar transistor and a base of the first bipolar transistor.

9. The voltage controlled oscillator of claim 8, wherein both the first and second bipolar transistors are NPN type, and both the first and second MOS transistors are NMOS type.

10. The voltage controlled oscillator of claim 8, wherein gates of the first and second MOS transistors are connected together and being applied a voltage for controlling the frequency of the voltage controlled oscillator.

11. The voltage controlled oscillator of claim 8 further comprises:
a first varactor connected between the base of the first bipolar transistor and a first node;
a second varactor connected between the base of the second bipolar transistor and the first node,
wherein a voltage supplied at the first node further controls the frequency of the voltage controlled oscillator.

12. The voltage controlled oscillator of claim 8 further comprises current control device for limiting current supply to both the first and second merged devices.

13. The voltage controlled oscillator of claim 12, wherein the current control device is a NMOS transistor.

14. A voltage controlled oscillator comprising:
a first merged device having a first bipolar transistor and a first MOS transistor, the first bipolar transistor having a collector sharing a common active area with a source/drain of the first MOS transistor, and an emitter sharing the common active area with another source/drain of the first MOS transistor;
a second merged device having a second bipolar transistor and a second MOS transistor, the second bipolar transistor having a collector sharing a common active area with a source/drain of the second MOS transistor, and an emitter sharing the common active area with another source/drain of the second MOS transistor; and
a first inductor connected to the source/drain of the first MOS transistor and a gate of the second MOS transistor.

15. The voltage controlled oscillator of claim 14, wherein both the first and second bipolar transistors are NPN type, and both the first and second MOS transistors are NMOS type.

16. The voltage controlled oscillator of claim 14, wherein bases of the first and second bipolar transistors are connected together and being applied a voltage for controlling the frequency of the voltage controlled oscillator.

17. The voltage controlled oscillator of claim 14 further comprises a second inductor connected to the source/drain of the second MOS transistor and a gate of the first MOS transistor.

18. The voltage controlled oscillator of claim 14 further comprises:
a first varactor connected between the gate of the first MOS transistor and a first node; and
a second varactor connected between the gate of the second MOS transistor and the first node,
wherein a voltage supplied at the first node further controls the frequency of the voltage controlled oscillator.

19. The voltage controlled oscillator of claim 14 further comprises current control device for limiting current supply to both the first and second merged devices.

20. The voltage controlled oscillator of claim 19, wherein the current control device is a NMOS transistor.

* * * * *